(12) United States Patent
Ferling et al.

(10) Patent No.: US 6,479,759 B2
(45) Date of Patent: Nov. 12, 2002

(54) SUBMOUNT, ELECTRONIC ASSEMBLY AND PROCESS FOR PRODUCING THE SAME

(75) Inventors: Dieter Ferling, Stuttgart (DE); Anca Gutu-Nelle, Stuttgart (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/906,849

(22) Filed: Jul. 18, 2001

(65) Prior Publication Data

US 2002/0007962 A1 Jan. 24, 2002

(30) Foreign Application Priority Data

Jul. 19, 2000 (DE) .......................................... 100 35 399

(51) Int. Cl.⁷ .............................. H05K 1/00; H05K 1/16
(52) U.S. Cl. ........................ 174/260; 174/256; 174/261; 361/760; 361/807; 257/778; 257/784
(58) Field of Search ................................. 174/252, 256, 174/260, 261, 52.4; 361/760, 764, 776, 803, 807, 808, 748, 752, 763, 767, 774; 257/784, 779, 432, 99, 778; 29/832, 846, 850, 854

(56) References Cited

U.S. PATENT DOCUMENTS

| | | | |
|---|---|---|---|
| 4,396,936 A | * 8/1983 | McIver et al. ............... | 174/252 |
| 4,866,571 A | * 9/1989 | Butt ............................ | 361/717 |
| 4,888,449 A | * 12/1989 | Crane et al. ................ | 174/52.4 |
| 5,256,901 A | * 10/1993 | Ohashi et al. ............... | 257/680 |
| 5,490,324 A | * 2/1996 | Newman ..................... | 29/830 |
| 5,576,934 A | * 11/1996 | Roethlinghsoefer et al. ..... | 361/761 |
| 5,764,484 A | * 6/1998 | Hoffman et al. ............. | 361/761 |
| 5,767,446 A | * 6/1998 | Ha et al. ..................... | 174/52.4 |
| 6,014,318 A | * 1/2000 | Takeda ........................ | 361/764 |
| RE36,773 E | * 7/2000 | Nomi et al. ................. | 361/760 |
| 6,121,686 A | * 9/2000 | Togawa ....................... | 257/778 |
| 6,294,838 B1 | * 9/2001 | Peng ........................... | 257/777 |
| 6,294,839 B1 | * 9/2001 | Mess et al. .................. | 257/777 |

FOREIGN PATENT DOCUMENTS

DE       195 22 591 A1     1/1997

* cited by examiner

Primary Examiner—Kamand Cuneo
Assistant Examiner—I B Patel
(74) Attorney, Agent, or Firm—Sughrue Mion, PLLC

(57) ABSTRACT

Electronic components, in particular opto-electronic components, are conventionally mounted onto a submount, on the surface of which there are located contact areas for the electrical contacting of the components. A so-called crosstalk may arise between two components. This interference effect clearly reduces the signal/interference ratio of the message signals and hence the performance of the assembly. Here it is proposed to introduce into the submount (1), at least beneath the point at which the first contact area (5) is located, a depression (8) which is provided with a metal film (6a) and filled with a dielectric, the metal film (6a) being electrically connected to the second, opposite-pole contact area (6). Hence the field lines are concentrated in the depression which is filled with the dielectric, whereby the metal film which is applied there shields the material of the submount against penetration of the field lines. The creation of a depression has the advantage that the overall height of the new arrangement is preserved in comparison with a traditional arrangement.

11 Claims, 2 Drawing Sheets

SUBMOUNT, ELECTRONIC ASSEMBLY AND PROCESS FOR PRODUCING THE SAME

BACKGROUND OF THE INVENTION

1. Field of the Invention

The invention relates to a submount for electronic components according to the preamble to claim 1. In addition, the invention relates to an assembly with at least one such component and to a process for producing such an assembly according to one of the associated claims.

2. Description of the Related Art

Electronic components, in particular opto-electronic components, are conventionally mounted onto a submount which, for example, consists of silicon or of ceramic material. Contact areas for the electrical contacting of the components are located on the surface of the submount. Contacting is conventionally effected by so-called bonding, a process wherein the contacts on the upper side of the components are connected to one another to the contact areas of the submount via fine gold wires. The contacts located on the underside of the components are connected to the contact areas in accordance with the so-called flip-chip process. For correct positioning of the components, base areas are conventionally provided which frequently consist of glass material that is also used for producing optical waveguides. This technology is frequently employed in the domain of optical message transmission, in which laser-generated light is modulated and transmitted. The assemblies consisting of one or even several components have to be very powerful, this being required especially in the domain of optical telecommunications where very short switching-times of less than 200 picoseconds and correspondingly high data-transfer rates of up to 10 Gbit/s are to be attained. The components that are used are, for example, opto-electronic switching circuits which are constructed as optical transmitters or amplifiers. In the case where several components are arranged on a submount, so-called crosstalk may arise between components that are directly adjacent to one another. This interference effect clearly reduces the signal/interference ratio of the message signals and hence the performance of the assembly.

An assembly with a submount and with opto-electronic components arranged thereon is known from DE-A-195 22 591. The subassemblies described therein include, inter alia, an optical coupler, an emitting light source connected to said optical coupler, and light-signal detectors. In order to reduce the electrical crosstalk arising between the light source and the light detectors, the light source, on the one hand, and the light detectors, on the other hand, are arranged in this patent on opposite sides of the coupler. Hence the mutually interfering components are accordingly arranged far away from one another, in order to achieve a spatial separation that is as great as possible. But this measure cannot always be implemented, in particular not in the case of highly integrated assemblies. In addition, this measure conflicts with the desire to be able to configure the placement of the components on the submount as freely as possible.

SUMMARY OF THE INVENTION

The object of the invention is to create a submount for electronic components, with which the aforementioned problems do not arise. In addition, an assembly with such a submount and a process for producing such an assembly are to be proposed.

The object is achieved by means of a submount having the features according to claim 1 and also by means of an assembly and a process having the features according to one of the associated claims.

Accordingly, a submount for electronic components is proposed that has a surface on which a first contact area and a second, opposite-pole contact area for the electrical contacting of one of the electronic components are applied and that has, at least beneath the point at which the first contact area is located, a depression which is provided with a metal film and filled with a dielectric, the metal film being electrically connected to the second contact area.

Correspondingly, the assembly according to the invention has at least one electrical component and a submount with a surface on which a first contact area and a second contact area for the electrical contacting of the electronic component are applied. And the assembly is characterised in that the submount has, at least beneath the point at which the first contact area is located, a depression which is provided with a metal film and filled with a dielectric, and in that the metal film is electrically connected to the second contact area. With a view to producing the assembly, in accordance with the invention a depression is accordingly introduced into the submount, at least beneath the point at which the first contact area is located, the depression being provided with a metal film and filled with a dielectric, and the metal film being electrically connected to the second contact area.

The invention proceeds from the perception that in the case of a traditional submount the interfering crosstalk is substantially brought about by field lines arising that extend between the opposite-pole contact areas, whereby they penetrate for the most part into the material of the submount and are propagated from the region of one component to the regions of the adjacent components and beyond. By virtue of the measures according to the invention, however, the field lines are concentrated in the depression which is filled up with the dielectric, whereby the metal film which is applied there shields the material of the submount against penetration of the field lines. Accordingly a region defined by the dimensions of the depression between the first contact area and the metallic surface (opposite pole) connected to the second contact area is created, in which the greater part of the field lines is captured. The creation of a depression has the advantage that the overall height of the new arrangement is preserved in comparison with a traditional arrangement. In addition, the coating of the depression with metal and the subsequent filling with a dielectric can be carried out very precisely with a thin-film process known as such. The invention, which is simple to realize, as well as the advantages resulting from the invention, will be described in detail later.

Particular advantages of the invention are evident from the dependent claims:

It is accordingly particularly advantageous if the depression is filled with a polymer up to a height that terminates with the surface of the submount. For the polymer can already be processed very easily when heated to 400° C., for example, i.e. at a temperature far below the melting-temperature of glass or metal, and can be introduced into the depression. The filling-height can also be adapted exactly to the level of the surface of the submount, as a result of which the original overall height of the total arrangement is preserved.

It is advantageous if the metal film and the dielectric are established by thin-film technology. Hence a very precise geometry of the arrangement can be conformed to.

The submount preferably consists of silicon, and the component is preferably an opto-electronic component. In addition, it is advantageous if the first contact area together with at least two base areas connect the component to the submount in accordance with the flip-chip method. By this means, a very rapid and exactly fitting positioning and also contacting of the component is obtained. In this context it is a particular advantage if the base areas consist of a glass material.

BRIEF DESCRIPTION OF THE DRAWINGS

The invention will be described precisely in the following on the basis of an embodiment example and with the aid of the following drawings.

DESCRIPTION OF THE PREFERRED EMBODIMENTS

Figure 1:
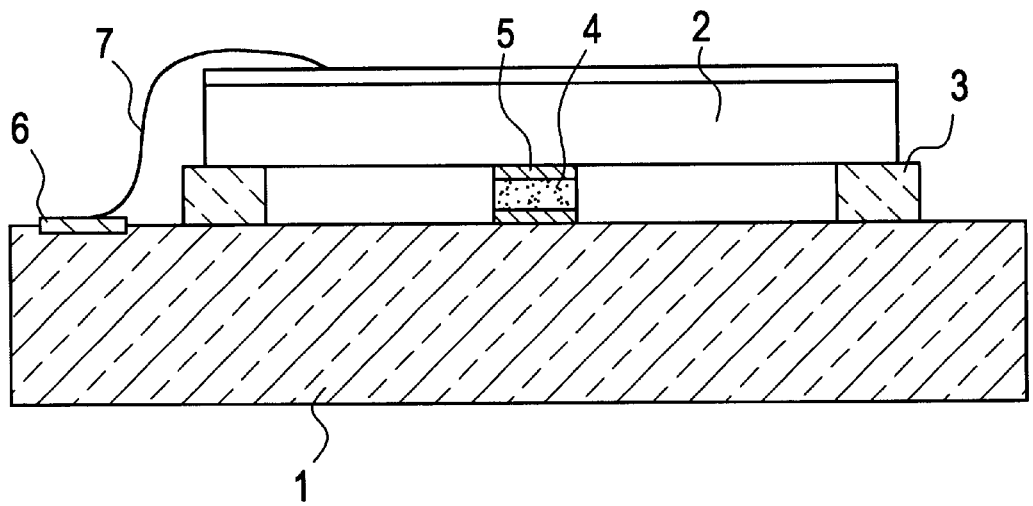
FIG. 1 which shows schematically the structure of a traditional submount in cross-section.

FIG. 1 shows in cross-section the structure of a traditional submount 1 on which a component 2 is mounted. The submount, which is also called a circuit mount, consists of silicon and has contact areas on its surface for the electrical contacting of the component 2, namely a first contact area 5 and a second, opposite-pole contact area 6. Via these contact areas, which consist of gold for example, the component 2 is supplied with voltage. In accordance with the so-called flip-chip technology the component 2 is connected to the first contact area 5 via a soldering material 4. The component 2 is connected to the second contact area 6 via a bonding wire 7. With a view to precise positioning of the component, the submount 1 has two base areas 3 which consist of glass material and on which the component is supported. The base areas consist of silicon oxide (SiO$_2$), a proven optical-waveguide material, and have a height of about 20 μm. By virtue of the geometry of the base areas and with the aid of the flip-chip contacting, the component 2 is precisely positioned and fixed on the submount 1.

Opto-electronic circuits, such as amplifiers or laser-diode transmitters, for example, are conventionally mounted on a submount and contacted in a manner corresponding to FIG. 1. The problem in the case of the traditional arrangement which is represented is that electrical field lines spread out from the one contact area to the opposite-pole contact area and penetrate the submount material, the field lines being detached from this region and being capable of spreading out into the regions of the other components. As a result, two components (circuits) are able to interfere reciprocally in their operation. This type of interference is also called crosstalk and leads to a reduction of the signal/interference ratio.

Figure 2:
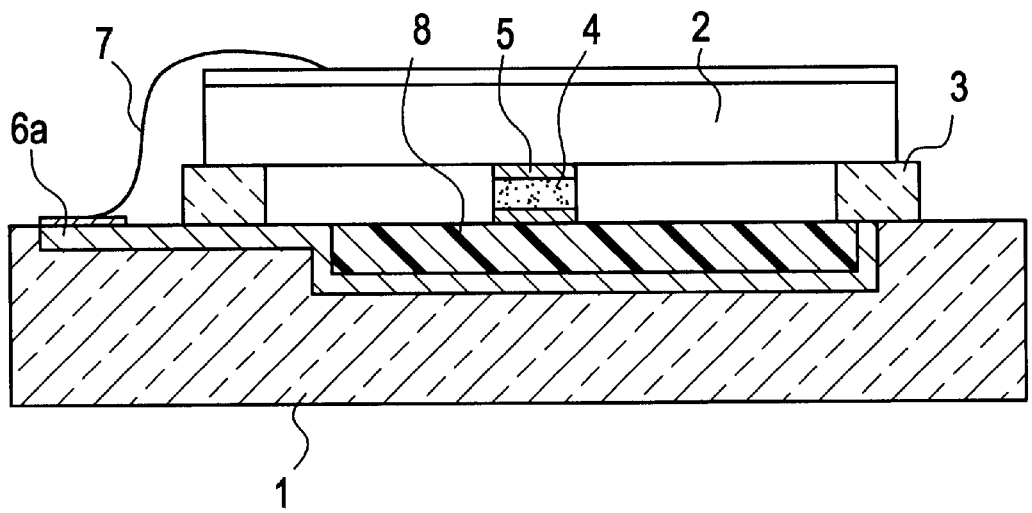
FIG. 2 which shows the structure of a submount according to the invention in cross-section.

Now FIG. 2 shows an example of an embodiment of the invention in which these problems do not arise. In comparison with FIG. 1, the submount 1 that is represented in FIG. 2 has a depression 8 beneath the point at which the first contact area 5 is located. The wall of the depression 8 is provided with a metal film 6a consisting of gold, which is electrically connected to the second, opposite-pole contact area 6. In addition, the depression 8 has been filled with a polymer which serves as a dielectric. The electrical field lines spreading out from the first contact area 5 are concentrated in the dielectric and intercepted by the metal film 6a. Consequently the electrical field lines are unable to penetrate the material of the submount. A spreading of field lines into the region of adjacent components or beyond and a crosstalk resulting therefrom are consequently clearly reduced. Measurements have shown that in the case of the assembly according to the invention a crosstalk arises that is about 40 dB lower than in the case of a traditional assembly.

By virtue of the creation of the depression 8 it is possible to retain the overall height of the total arrangement and, moreover, to retain the flip-chip method for optimal positioning and contacting of the component 2. To this end, the depression is filled with the polymer exactly as far as the edge, that is, the filling-height of the depression 8 terminates with the surface of the submount 1.

Figure 3:
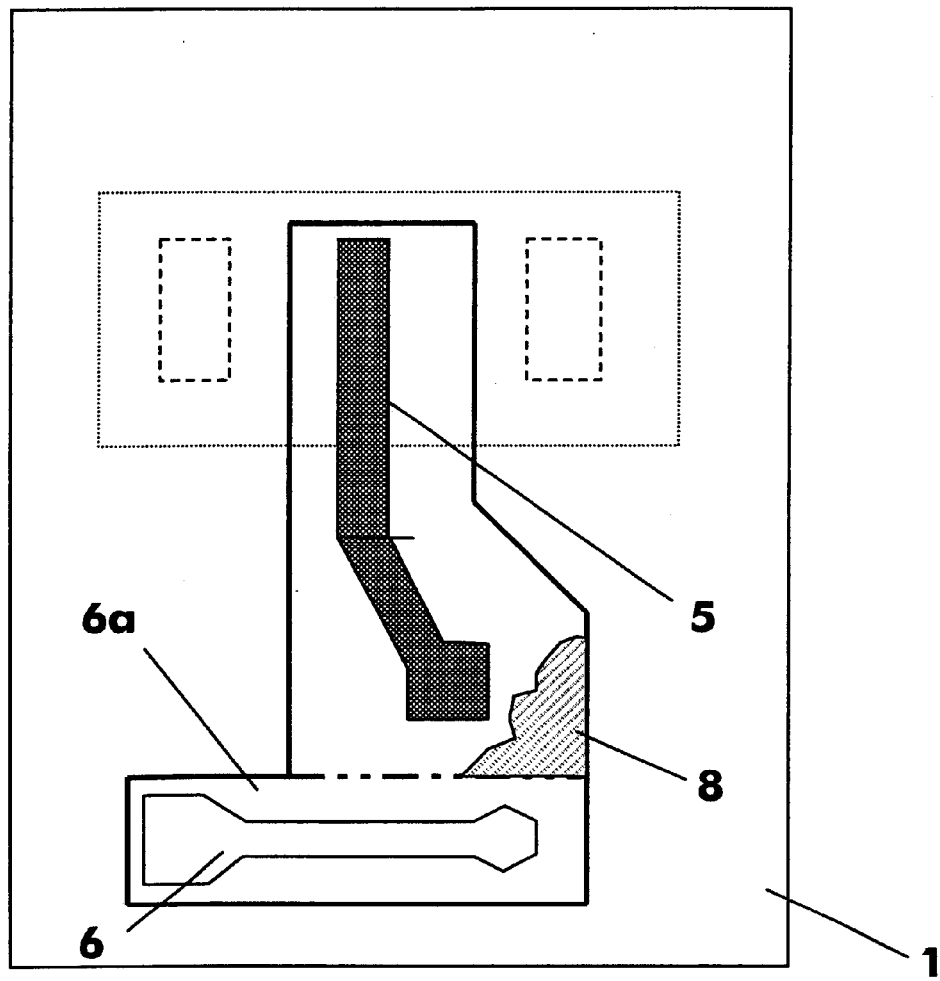
FIG. 3 which shows the structure of the submount according to the invention in top view.

FIG. 3 shows in top view the arrangement according to the invention and especially the contours of the contact areas 5 and 6 as well as the geometry of the depression 8 which is filled with the polymer. The first contact area 5 extends at right angles to the orientation of the component 2 between the two bases and terminates at a contact point arranged in the external marginal region of the component 2. This contact point serves for connection to one pole (here the positive pole) of the power supply. The second, opposite-pole contact area 6 is a metal strip which is applied outside the marginal region of the component 2 in the longitudinal direction, with two contact points arranged at its ends. The one contact point serves for fixing the bonding wire, the other contact point serves for connection of the opposite pole (here the negative pole) of the power supply.

The depression 8 which is introduced within the submount 1 begins beneath the component 2 and extends beyond the marginal region of the component 2 to the second contact area 6. In so doing, the depression 8 substantially comprises the regions beneath the first contact area 5. The depression takes the form of a trough and is vapour-coated with a metal film 6a consisting of gold; the metal film extends beyond the depression 8 into the region of the second contact area 6. The metal film 6a is electrically connected there to this second contact area 6. By this means, the metal film 6a acts like a shield which traps the electrical field lines that emerge from the first contact area 5. By virtue of the fact that the depression 8 is filled up with a polymer, the electrical field lines are concentrated in this polymer, as a result of which the predominant proportion of the electrical field lines remains within the depression 8. The field-line density outside the depression 8, in particular on the surface of the submount, is negligibly low. The depression 8 accordingly acts like a potential well in which the field lines remain. By virtue of this local shielding of the field lines, crosstalk to adjacent components is avoided. On the submount 1 that is represented in FIGS. 2 and 3, in addition to the component 2 which is represented, further components are also mounted which are not represented here. The arrangement consisting of the submount 1 and of several components constitutes an assembly. In order to prevent crosstalk between the components, it is sufficient if a depression is provided for substantially every second component. It is also conceivable to provide only those regions with depressions at which components that are susceptible to interference, such as detector circuits for example, are located. In the case of other circuits less susceptible to interference, particularly in the case of circuits that produce a lot of heat, such as strong lasers for instance, the depression can be dispensed with. In these special cases a depression that is filled up with polymer would be a hindrance to the dissipation of heat. However, in most cases it is advantageous if such a depression is sunk into the submount for each component. The process for producing the depression according to the invention can be effected by means of thin-film technology as follows:

First of all, the depression 8 is introduced into the planar submount 1 by means of milling or etching. After this, the wall of the depression is vapour-coated with gold, in order to form the metal film 6a that has been described. The metal film extends into the region of the second, opposite-pole contact area 6. The depression 8 itself is filled with a polymer as far as the height of the surface of the submount 1. A lateral boundary of the polymer material can be obtained by lithography. At the point provided for the contact area 5 the polymer is filled exactly, in order to attain a precise overall height. The first contact area 5 is then attached to the polymer. This contact area and also the base areas serve for contacting and fixing the component 2 using the flip-chip method which is known as such.

In the case of the invention that has been described, the depression in the submount was provided with a metal film which brings about an electrical shielding. However, it is also conceivable to provide a depression without a metal film and to fill this depression merely with a dielectric. To the extent that the capacitive behaviour of the component is to be borne in mind during operation, this arrangement would have the advantage that the depression which is filled with the dielectric would act as a parasitic capacitor which would be connected in parallel with the capacitor of the component. Since in comparison with silicon ($\epsilon_r=12$) the polymer has a relatively low relative permittivity of about $\epsilon_r=3$ to 4, the total capacitance of the arrangement diminishes and hence the limiting frequency is increased. In this way the operational behaviour of the assembly is improved by simple means. This arrangement, in which merely a depression is provided with a dielectric, consequently represents an independent solution to the problem of the capacitive behaviour of the assembly.

What is claimed is:

1. A submount (1) for at least one electronic component with a surface on which a first contact area (5) and a second contact area (6) for electrically contacting said at least one (2) electronic component, wherein the submount (1) has, at least beneath a point at which the first contact area (5) is located, a depression (8) which is provided with a metal film (6a) and filled with a dielectric, said metal film (6a) being electrically connected to the second contact area (6).

2. The submount (1) according to claim 1, wherein the depression (8) is filled with a polymer up to a height that terminates with the surface of the submount (1).

3. The submount (1) according to claim 1, wherein the submount (1) consists of silicon and said at least one electronic component is an opto-electronic component (2).

4. The submount (1) according to claim 1, wherein the metal film (6a) and the dielectric are established by thin-film technology.

5. The submount (1) according to claim 1, wherein the first contact area (5) together with at least two base areas (3) connect the component (2) to the submount (1) in accordance with the flip-chip method.

6. The submount (1) according to claim 5, wherein said at least two base areas (3) consist of a glass material.

7. The submount according to claim 1, wherein the second contact area is located between an end portion of said submount and one of at least two base areas.

8. An electronic assembly with at least one electrical component (2) and with a submount (1) which has a surface on which a first contact area (5) and a second contact area (6) for electrically contacting said at least one electronic component (2), wherein the submount (1) has, at least beneath a point at which the first contact area (5) is located, a depression (8) which is provided with a metal film (6a) and filled with a dielectric, said metal film (6a) being electrically connected to the second contact area (6).

9. The electronic assembly according to claim 8, wherein the second contact area is located between an end portion of said submount and one of at least two base areas.

10. A process for producing an electronic assembly, wherein a first contact area (5) and a second contact area (6) are applied onto a surface of a submount (1) and wherein at least one electronic component (2) is contacted the contact areas (5, 6), wherein a depression (8) is introduced into the submount (1), at least beneath a point at which the first contact area (5) is located, the depression being provided with a metal film (6a) and filled with a dielectric, and the metal film (6a) being electrically connected to the second contact area (6).

11. The process according to claim 10, wherein the second contact area is located between an end portion of said submount and one of at least two base areas.

* * * * *